(12) United States Patent
Kumar et al.

(10) Patent No.: US 7,105,845 B2
(45) Date of Patent: Sep. 12, 2006

(54) LIQUID CRYSTAL ALIGNMENT USING ELECTRON BEAM EXPOSURE

(75) Inventors: Satyendra Kumar, Kent, OH (US); Carlos Vargas-Aburto, Fairborn, OH (US); Qingbing Wang, Cuyahoga Falls, OH (US)

(73) Assignee: Kent State University, Kent, OH (US)

( * ) Notice: Subject to any disclaimer, the term of this patent is extended or adjusted under 35 U.S.C. 154(b) by 0 days.

(21) Appl. No.: 10/883,871

(22) Filed: Jul. 2, 2004

(65) Prior Publication Data

US 2006/0000986 A1   Jan. 5, 2006

(51) Int. Cl.
*A61N 5/00* (2006.01)
*G21G 5/00* (2006.01)

(52) U.S. Cl. ............................ 250/492.3; 250/492.1

(58) Field of Classification Search .............. 250/492.3
See application file for complete search history.

(56) References Cited

U.S. PATENT DOCUMENTS

| | | | |
|---|---|---|---|
| 5,434,420 | A | 7/1995 | McKeown et al. |
| 5,770,826 | A | 6/1998 | Chaudhari et al. |
| 6,124,914 | A | 9/2000 | Chaudhari et al. |
| 6,577,365 | B1 | 6/2003 | Chaudhari et al. |
| 6,633,366 | B1 * | 10/2003 | de Jager et al. ............ 355/67 |
| 6,912,031 | B1 * | 6/2005 | Ohnishi ................... 349/123 |

OTHER PUBLICATIONS

Chaudhari et al., "Atomic-beam Alignment of Inorganic Materials for Liquid-Crystal Displays," Nature, vol. 411 pp. 56-59, (May 3, 2001).

Chang, "Fourth-Generation TFT-LCD Production Line," SID 00 Digest, pp. 64-67, (2000).

Souk, "40 Inch Wide XGA TFT-LCD for HDTV Application," SID 02 Digest, pp. 1277-1279, (2002).

Schadt et al., "Surface-Induced Parallel Alignment of Liquid Crystals by Linearly Polymerized Photopolymers," Journal of Applied Physics, vol. 31 pp. 2155-2164 (1992).

Nehring et al., "High-pretilt Polyphenylene Layers for Liquid-Crystal Displays," Appl. Phys. Lett. 51, p. 1283 (1987).

Uchida et al., "Surface Alignment of Liquid Crystals," B. Bahadur, World Scientific, Singapore, pp. 5.1-32 (1991).

Chigrinov, "Liquid Crystal Devices: Physics and Applications," chapter 1., Artech House, pp. 43-83 (1999).

Ohgawara, et al., "Liquid Crystal Orientation on Various Surfaces," Mol. Cryst. Liq. Crystl., vol. 74, pp. 227-242 (1981).

Yaroshchuk et al, Proc. SPIE 4418, 49 (2001).

* cited by examiner

*Primary Examiner*—John R. Lee
*Assistant Examiner*—Jennifer Yantorno
(74) *Attorney, Agent, or Firm*—Fay, Sharpe, Fagan, Minnich & McKee, LLP

(57) ABSTRACT

An apparatus (10, 10") for producing an alignment surface on an associated substrate (12, 12") of a liquid crystal display. An electron source (40) produces a collimated electron beam (50). A substrate support (20, 20") supports the associated substrate (12, 12") with a surface normal (80) of the substrate arranged at a preselected angle ($\alpha$) relative to the collimated electron beam (50). The collimated electron beam (50) is rastered across the associated substrate (12, 12") at the preselected angle ($\alpha$) while the substrate moves through the electron beam.

20 Claims, 4 Drawing Sheets

LIQUID CRYSTAL ALIGNMENT USING ELECTRON BEAM EXPOSURE

BACKGROUND

The present invention relates to the fabrication of liquid crystal devices. It particularly relates to liquid crystal displays having a liquid crystal layer disposed on an alignment layer that affects substantially the alignment of molecules in the liquid crystal layer. However, the invention will also find application in conjunction with other liquid crystal applications.

Liquid crystals are used in numerous display devices, such as notebook computers, desktop monitors, cellular telephone displays, high definition television, and the like, and in other photonic devices such as optical multiplexing coupler, switches, data storage, and so forth. The liquid crystal display typically includes a thin liquid crystal layer sandwiched between a pair of substrates of glass or another substantially light transmissive material. At least one of the substrates must be transparent. The display usually also includes one or two optical polarizer layers that cooperate with the liquid crystal layer and with biasing electronics to locally optically modulate optical path length of the LC film that in turn determines the opacity or reflectance of the liquid crystal display and changes pixel intensity.

In an active matrix liquid crystal display, independently addressable thin film transistors are fabricated on the substrate to serve as the biasing electronics. In backlit displays, a backlight is disposed behind the liquid crystal display, and the biasing electronics locally modulate opacity of the liquid crystal display to darken or brighten pixels. In reflective displays, the reflectance of the display is modulated. Color filters matched with primary color sub-pixels are included in color displays. Moreover, some liquid crystal displays employ a flexible substrate material such as a polymer film or flexiglass to provide a flexible display.

Regardless of the specific configuration and the type of liquid crystal display, a common element is one or more alignment surfaces that bias molecules of the liquid crystal toward a selected spatial alignment or orientation. A well known approach to forming the alignment surface is the rubbing method, in which a polyimide or other polymeric film is deposited on the substrate and physically rubbed using a velvet cloth to produce a directional or anisotropic template for molecules of the liquid crystal. The rubbing method is convenient and widely used in the industry; however, the method has substantial disadvantages, including a high potential for contamination, mechanical defects and damage, static charge generation which can damage the transistors in active matrix displays, and difficulty of obtaining uniformity in rubbing strength over large areas.

As the liquid crystal display industry moves toward larger area and higher resolution displays, there has been an increasing desire to develop an improved method for forming the alignment surface which does not involve physically contacting the substrate. For example, U.S. Pat. No. 5,770,826 issued to Chaudhari et al. discloses a non-contact method that uses a low energy ion beam to define the alignment surface. Other methods include deposition of a Langmuir-Blodgett film, oblique angle deposition of silicon oxide or other inorganic materials, exposure of a polymer film to polarized ultraviolet radiation, and plasma irradiation.

While these methods improve upon the rubbing method by eliminating physical contact, they have a number of disadvantages. Direct formation of an alignment surface that is uniform over large areas by direct deposition of an anisotropic alignment layer is difficult, especially for substrate areas on the order of several square meters which are preferred for large-area displays and for high manufacturing throughput. The ion beam and plasma irradiation methods are both performed in a vacuum environment, which is difficult to achieve over a large-area substrate and reduces manufacturing throughput. Moreover, as these methods are performed prior to sealing of the liquid crystal film, they can introduce contamination that degrades the liquid crystal display.

The present invention contemplates an improved apparatus and method which overcomes the aforementioned limitations and others. In place of rubbing, deposition, UV or plasma exposure, this method uses exposure to electron beam, which can be performed at ambient conditions. The exposure modifies the surface properties that causes the liquid crystal molecules to anchor at specific orientations with respect to the substrate.

SUMMARY

According to one aspect, an apparatus is disclosed for producing an alignment surface on an associated substrate of a liquid crystal display. An electron source produces a collimated electron beam. A substrate support supports the associated substrate with a surface normal of the substrate arranged at a preselected angle relative to the collimated electron beam. A scanner relatively moves the collimated electron beam of predetermined energy (voltage) and flux (current) across the associated substrate at the preselected angle and at a predetermined frequency.

According to another aspect, an apparatus is disclosed for producing an alignment surface on an associated substrate of a liquid crystal display. A particle source produces a collimated particle beam passing through air. A substrate support supports the associated substrate in air with a surface normal of the substrate arranged at a preselected angle relative to the collimated particle beam. A rastering mechanism relatively rasters the collimated particle beam across the associated substrate at the preselected angle and at a predetermined frequency.

According to yet another aspect, a method is provided for producing an alignment surface on an associated substrate of a liquid crystal display. A processing area of the associated substrate is bombarded with a collimated electron beam at a preselected beam angle. The processing area is rastered over the associated substrate.

Numerous advantages and benefits of the present invention will become apparent to those of ordinary skill in the art upon reading the following detailed description of the preferred embodiment.

BRIEF DESCRIPTION OF THE DRAWINGS

The invention may take form in various components and arrangements of components, and in various process operations and arrangements of process operations. The drawings are only for the purpose of illustrating preferred embodiments and are not to be construed as limiting the invention.

DETAILED DESCRIPTION OF THE PREFERRED EMBODIMENTS

Figure 1:
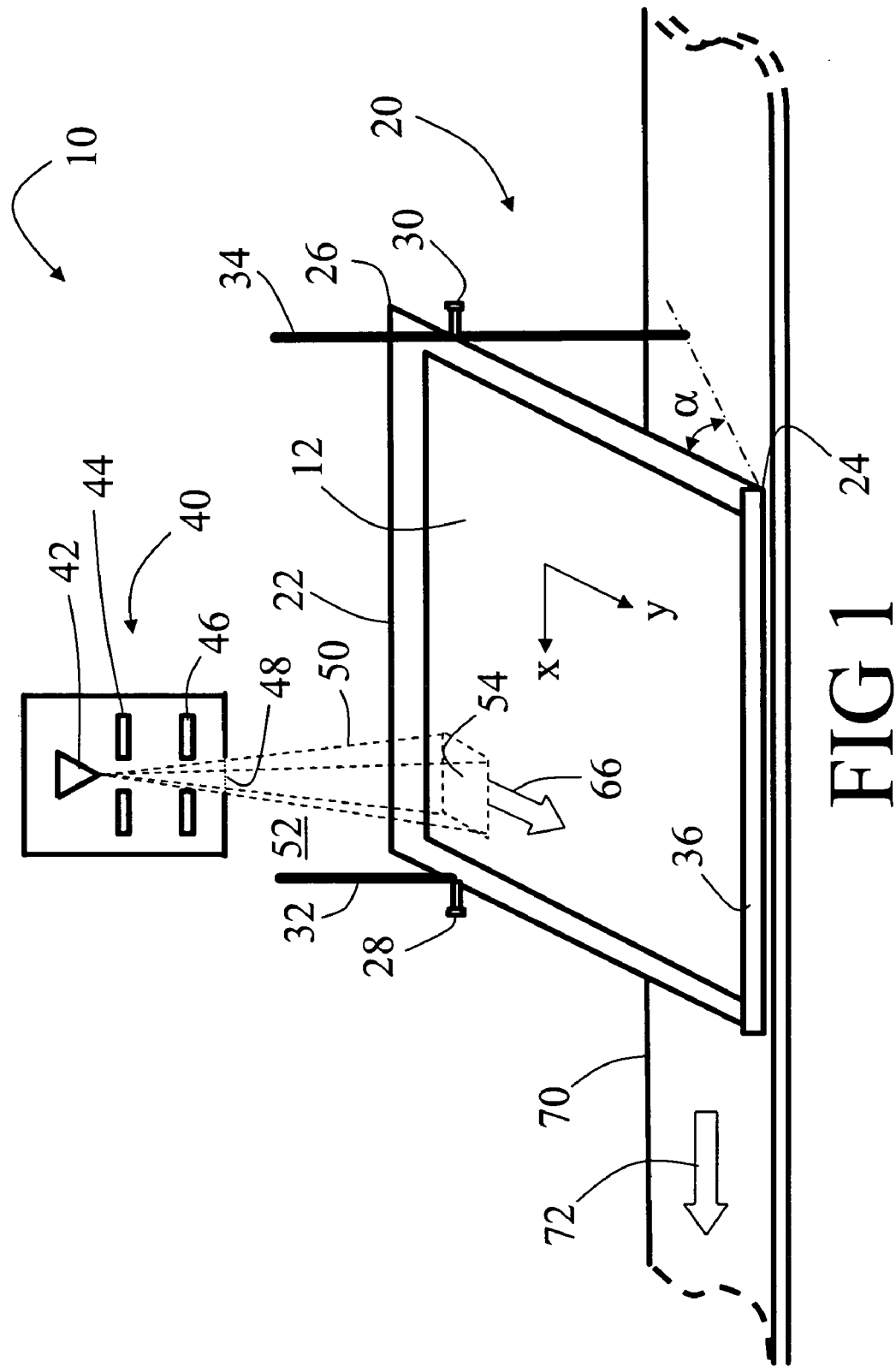
FIG. 1 shows an apparatus for producing an alignment surface on a substrate for fabricating a liquid crystal display.

With reference to FIG. 1, an apparatus 10 for forming an alignment surface on a substrate 12 of a liquid crystal display is described. The substrate 12 can be a rigid substrate such as a glass substrate, or a flexible substrate such as a polymer film substrate. The substrate 12 is arranged in a generally flat or planar fashion on a substrate support 20 that includes a generally planar surface 22 supported at a preselected angle $\alpha$ relative to the horizontal by a pivotally secured first edge 24 and a second edge 26 that is supported on at a selected height by support pins 28, 30 or other fasteners secured to vertical rods 32, 34. A lip 36 disposed on the first edge 24 prevents the substrate 12 from sliding off the tilted planar surface 22. The lip 36 is optionally omitted if friction between the substrate 12 and the planar surface 22 is sufficient to retain the substrate 12. The lip 36 can also be omitted if the substrate is fixed in its position by other means.

An electron source 40 (shown diagrammatically) includes an electron-generating filament 42, a positively biased anode or assembly of electrodes 44 that draws electrons from the filament 42, and an acceleration grid 46 that accelerates and directs the electrons through a thin metal window 48 or other aperture to form a high energy electron beam 50. The acceleration grid 46 is electrically biased to impart a selected kinetic energy to the electron beam 50, and may include an array or other arrangement of variably electrically biased grid electrodes along the direction of the electron beam 50 to shape the acceleration field.

The electron beam 50 is preferably substantially collimated by the acceleration grid 46 or other collimation component or components of the electron source 40. However, there may be some divergence of the electron beam 50, as is shown in FIG. 1. In FIG. 1 the electron beam 50 has a generally square cross-section; however, the electron beam can have a circular, elliptical, or otherwise-shaped cross-section.

In a preferred embodiment, the imparted kinetic energy is at least one hundred kilo electron volts (100 keV). A suitable electron source is an electron linear accelerator (linac). Advantageously, for electron kinetic energies of around 1 MeV or higher the particle range in air is of order one meter or longer. Hence, the electron beam 50 passes through an ambient 52, which is preferably an air ambient, and bombards the substrate 12 in a processing area 54 that substantially corresponds to a footprint of the electron beam 50 on the substrate 12.

Because of the high range in air of high energy electrons, an air ambient at about atmospheric pressure can be used, and so no vacuum chamber or other airtight enclosure is required. Instead of an air ambient, a controlled gas ambient can be employed. For example, a selected gas ambient at a pressure greater than or equal to about 1 millitorr can be arranged around the substrate 12 using a suitable airtight enclosure (not shown) and a vacuum pump, and related equipment.

It will be appreciated that such a relatively high-pressure ambient is not compatible with low energy electron bombardment, ion beam bombardment, and plasma alignment surface formation methods, but is compatible with the apparatus 10 which applies high energy electron bombardment. Moreover, since the electron beam 50 readily passes through air, even in the case of a non-air ambient the airtight enclosure suitably is restricted to encompass the substrate 12 without extending over the electron source 40. Optionally, the selected ambient can be a vacuum ambient. Due to its simplicity, however, an air ambient with no enclosure, as shown in FIG. 1, is preferred unless the substrate 12 has a chemistry that adversely reacts with air during electron bombardment.

For a substrate 12 having typical dimensions of a few meters on a side, the processing area 54 is typically substantially smaller than the area of the substrate 12. For example, the processing area 54 may be a few centimeters on a side. The processing area 54 is preferably rastered or scanned across the surface of the substrate 12 using a suitable scanner. In the embodiment illustrated in FIG. 1, the electron beam is rastered in a direction indicated by arrow 66 by a suitable beam deflector, such as by controlling a deflecting potential difference applied to the electron beam by electrodes of the assembly of electrodes 44. The frequency, rate, or speed of rastering can be controlled, and is typically around 100 Hz. The substrate support 20 is arranged on a linear track 70 that is movable in a linear direction (indicated by arrow 72) generally transverse to the direction of electron beam rastering.

By rastering the electron beam in one direction and moving the substrate in the transverse direction at a predetermined speed, the processing area 54 is suitably scanned across the surface in a manner which controls the radiation dosage of the exposure. Substrates of substantially arbitrary size can be processed or scanned without placing the substrate in vacuum. Moreover, since the apparatus 10 preferably operates in air there is no substrate size restriction imposed by a finite-sized vacuum chamber. In some embodiments in which the processing area 54 is coextensive with the area of the substrate 12, the rastering component of the scanning is suitably omitted.

Figure 2:
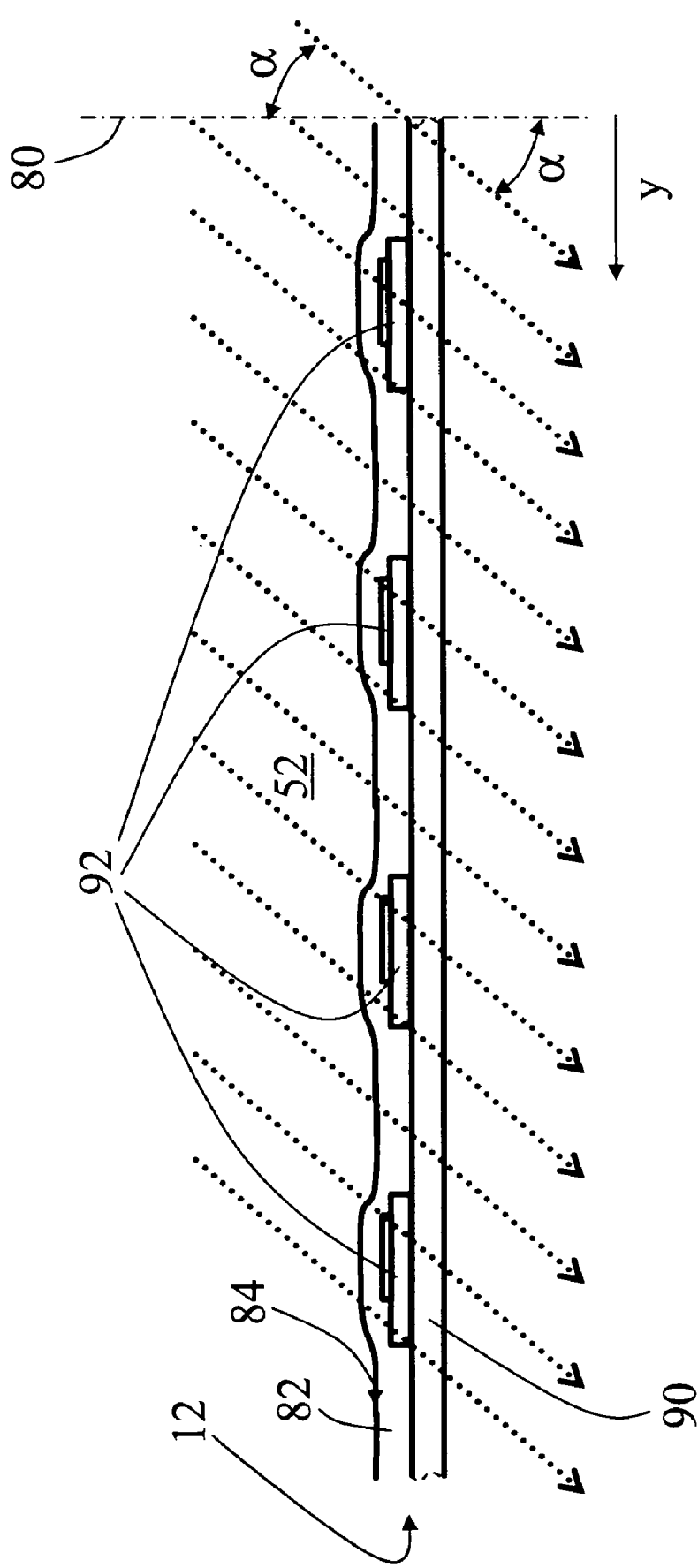
FIG. 2 diagrammatically shows a geometrical configuration of the electron bombardment provided by the apparatus of FIG. 1.

With continuing reference to FIG. 1 and with further reference to FIG. 2, the geometry of electron bombardment achieved by the apparatus 10 is described. An x-y coordinate system shown in FIG. 1 lies in the plane of the substrate 12. FIG. 2 shows a cross-section of the substrate 12 taken parallel to the y-direction and perpendicular to the x-direction. In FIG. 2, the direction in which electrons 50 travel through the substrate is represented by parallel dotted arrows slanted at the preselected angle $\alpha$ relative to a surface normal 80 of the substrate 12. The angle $\alpha$ in FIGS. 1 and 2 are identical due to the geometric configuration of the substrate support 20. It will be appreciated that the electron bombardment landing angle $\alpha$ shown in FIG. 2 can be achieved in other ways besides the exemplary tilting of the planar surface 22 shown in FIG. 1. For example, the substrate can be arranged horizontally, and the electron source tilted at the electron bombardment landing angle $\alpha$.

The electron beam 50 at useful energies has a long range in air of typically a few meters; moreover, the electron beam 50 readily passes through the relatively thin substrate 12 for most substrate materials and material combinations. Without limiting the scope of the invention to any particular theory of operation, it is believed that electron bombardment by the electron beam 50 causes a rearrangement of atoms or molecules on or in an exposed alignment layer 82 of the substrate 12. This can occur via induction of a chemical reaction or by breaking certain chemical bonds in the substrate accompanied by rearrangement of constituent atoms or molecular groups. The atomic or molecular rearrangement introduces some degree of physical and chemical anisotropy to the surface 84 of the alignment layer 82, and also possibly to an interior of the alignment layer 82. The anisotropy relates to the direction and preselected angle α of the electron beam 50.

In some types of substrates the alignment layer 82 is a polymeric material, for example, containing bi-phenyl side chain groups. Without limiting the scope of the invention to any particular theory of operation, it is believed that bi-phenyl rings having a direction generally perpendicular to the beam direction have a higher probability of interaction with the electron beam, and a higher probability of the corresponding chemical bonds being damaged by the electrons, as compared with bi-phenyl rings whose direction is generally parallel to the electron beam.

It will be recognized that other physical mechanisms can account for the formation of an alignment surface by electron bombardment. The mechanism may differ depending upon the material or materials making up the alignment layer. In general, the bombardment is believed to result in physical and/or chemical anisotropy on the surface of the substrate 12 which biases molecules of a subsequently applied liquid crystal layer (not shown in FIG. 2) toward a selected alignment.

Moreover, because most materials exhibit some response to high energy electron bombardment, a suitable alignment surface is expected to be produced on the alignment layer 82 for a large number of organic and inorganic alignment layer materials. Indeed, it is contemplated that a suitable alignment surface can be produced on a bare glass substrate or a glass substrate coated with indium tin oxide (ITO) using the apparatus 10.

Since the apparatus 10 does not require evacuation, the substrate 12 resides in ambient 52 which is preferably an air ambient. The substrate 12 can be partially processed prior to the electron bombardment. For example, in FIG. 2 the substrate 12 includes a glass substrate 90 on which thin film transistors 92 and other circuitry defining an active matrix have been fabricated, after which the alignment layer 82 was deposited. The partially fabricated substrate 12 including the thin film transistors 92 and other active matrix circuitry and the alignment layer 82 are then exposed to high energy electron bombardment by the apparatus 10 as shown in FIG. 2. After the electron bombardment, the liquid crystal layer is applied on top of the alignment layer 82. Molecules of the applied liquid crystal layer tend to align with an anisotropy of the alignment surface introduced by the electron bombardment.

Figure 3:
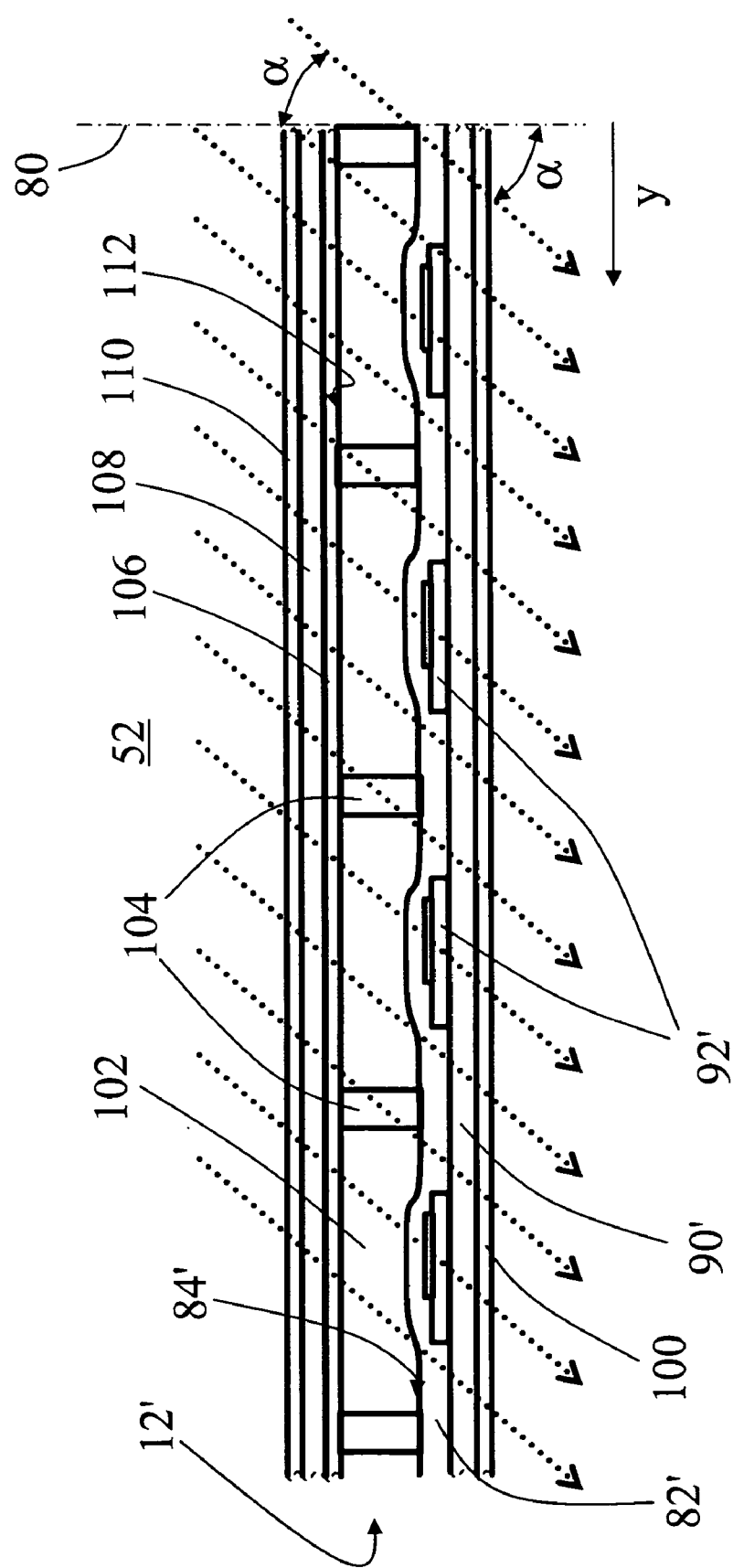
FIG. 3 diagrammatically shows a geometrical configuration of the electron bombardment provided by the apparatus of FIG. 1, with the processed substrate being a substantially completed liquid crystal display.

With reference to FIG. 3, another advantage of the apparatus 10 is described. As shown in FIG. 3, processing by the apparatus 10 to form the alignment surface can be postponed until at or near the end of the liquid crystal display manufacturing process. A substantially completed liquid crystal display 12' includes an alignment layer 82', glass substrate 90', and thin film transistors 92' that generally correspond to the alignment layer 82, glass substrate 90, and thin film transistors 92 shown in FIG. 2. Further display manufacturing processes performed prior to the electron bombardment have additionally added a bottom polarizer layer 100, liquid crystal layer 102, spacer elements 104, top alignment layer 106, color filter layer 108 (if needed), and top polarizer layer 110. Other liquid crystal display components can also be added prior to processing by the apparatus 10.

The substantially completed liquid crystal display 12' including components 82', 90', 92', 100, 102, 104, 106, 108, 110 is then processed by the apparatus 10 to form alignment surfaces at a first surface 84' of the bottom alignment layer 82' and at a second surface 112 of the top alignment layer 106. Because the high energy electrons of the electron beam 50 penetrate through the substantially completed liquid crystal display 12', the surfaces 84', 112 are processed and rendered anisotropic by the electron bombardment. Advantageously, this processing occurs after the liquid crystal layer 102 is applied and sealed, reducing the likelihood of contamination during alignment surface formation. Moreover, the processing occurs in the ambient 52 which is preferably an air ambient. Of course, if certain components of the liquid crystal display are sensitive to damage from electron bombardment, processing to add these components should be delayed until after the electron bombardment.

In one actually performed alignment surface formation process, a thin polymer alignment layer with bi-phenyl side chain groups deposited on a 2.4 m×1.2 m substrate was processed using 0.7 MeV electron bombardment with an electron beam current of 1 milliampere at a preselected landing angle α of 80°. These results are only examples; in general, process parameters such as the electron kinetic energy, electron beam current, and landing angle α are optimized for a given alignment layer configuration.

It will be appreciated that the apparatus 10 is exemplary only. Optionally, the electron source 40 can be replaced by another particle source that produces high energy particles having a long range in air and adequate interaction with the selected alignment layer material. For example, a proton beam can be employed; however, the range of high energy protons (for example, in the million electron volt range) is typically a few centimeters or less, which complicates adaptation of the apparatus 10 to proton sources. Substitution of a high energy photonic particle source such as an x-ray or gamma ray source is also contemplated. The electron source 40 is preferred, however, due to its long range in air coupled with strong high energy electron interaction with typical alignment layer materials. Moreover, the mechanical structure of the apparatus 10 is exemplary. Those skilled in the art can readily construct other mechanical arrangements for producing a relative rastering of the processing area 54 across the substrate 12. For example, the substrate could be immobile, and rastering in two transverse directions, such as x and y directions, provided by electromagnetic beam deflectors.

Figure 4:
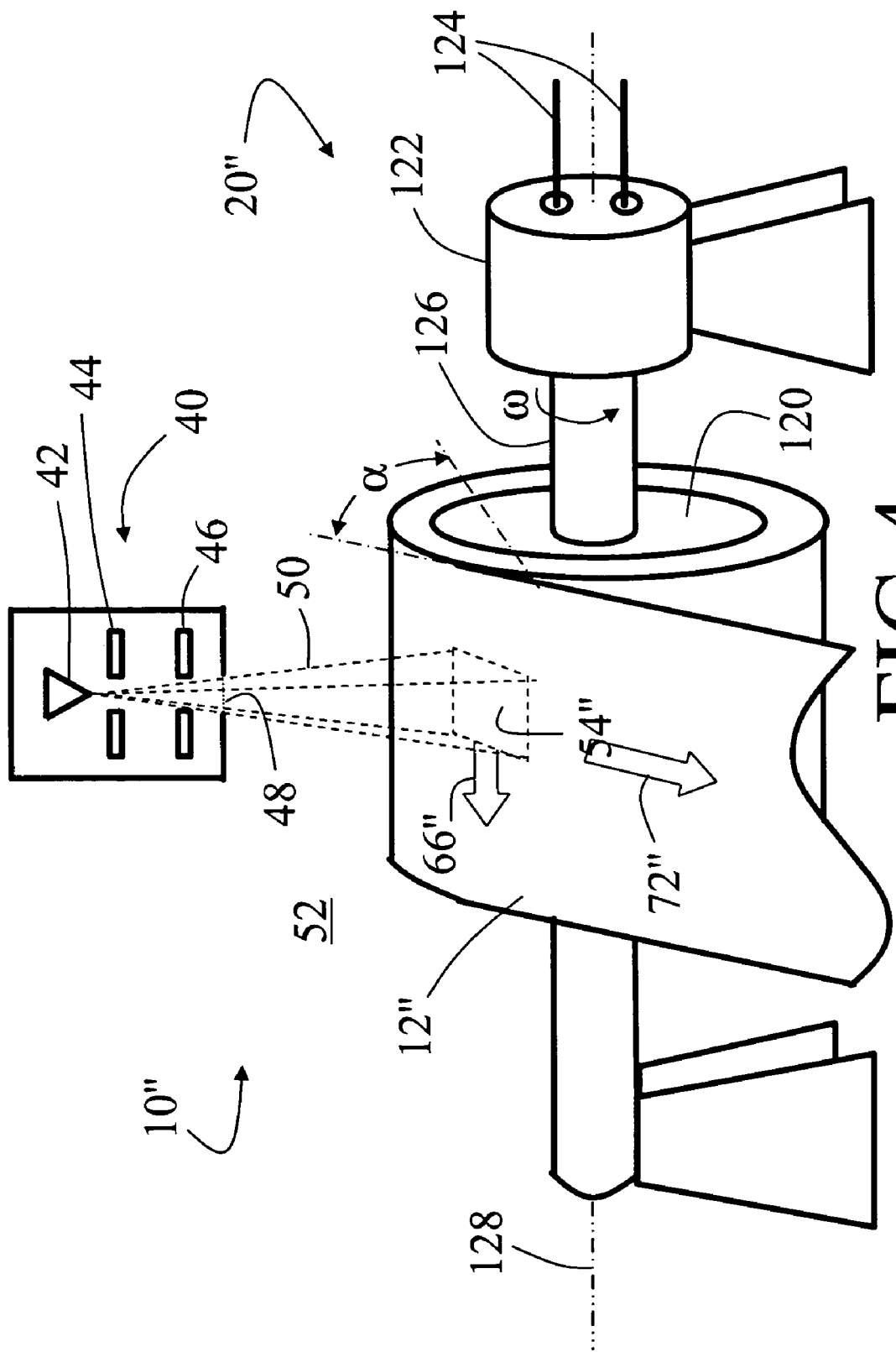
FIG. 4 shows an apparatus for producing an alignment surface on a flexible substrate for fabricating a liquid crystal display.

With reference to FIG. 4, a modified apparatus 10" is modified in that it includes a different substrate support 20" that is suited for handling a rolled flexible substrate 12" such as a flexiglass or polymer film substrate. The electron beam 50 produced by the electron source 40 passes through air 52 and is rastered in a direction 66" across the substrate 12".

The substrate support 20" includes cylinder 120 on which the flexible substrate 12" is wrapped. A rotary motor 122 electrically driven by power leads 124 rotates a drive shaft 126 coupled to the cylinder 120 about a cylinder axis 128 at a rotation rate ω to effect an unwrapping of the flexible substrate 12" off the cylinder 120 at a linear rate r×ω where r is a radius of the substrate 12" on the cylinder 120 and the rotation rate ω is measured in radians per second. Rather than employing continuous rotation, the motor 122 can be a stepper motor that performs the unwrapping in discrete steps. By rastering the beam in the direction 66" and wrapping or unwrapping the substrate 12" by rotation of the cylinder 120, the substrate 12" is scanned by the processing electron beam 50.

The electron beam 50 irradiates the substrate 12" over a processing area 54" disposed on the wrapped substrate 12" or around where the substrate 12" unwraps from the cylinder 120 so that substrate still on the roll is not exposed to the electron beam. The preselected angle α correlates with an angular position of the processing area 54" on the cylinder 120 or with an angle of the substrate 12" in the unwrapping region. The angle α can be adjusted by adjusting the take-off angle at which the substrate 12" is unwrapped, and/or by arranging the processing area 54" at a selected angular position on the substrate. Typically, the unwrapped portion of the substrate 12" is taken up on a take-up spool (not shown). Rather than applying the electron bombardment at the unwrapping cylinder 120, the electron bombardment can instead be applied during wrapping onto the take-up spool.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiments, the invention is now claimed to be:

1. An apparatus for producing an alignment surface on an associated substrate of a liquid crystal device, the apparatus including:
   an electron source that produces a collimated electron beam;
   a substrate support that supports the associated substrate with a surface normal of the substrate arranged at a preselected angle relative to the collimated electron beam, wherein the substrate is not disposed in an airtight enclosure; and
   a scanner that relatively moves the collimated electron beam across the associated substrate at the preselected angle.

2. The apparatus as set forth in claim 1, wherein the electron source produces electrons generally having kinetic energy of at least one million electron volts.

3. The apparatus as set forth in claim 1, wherein the electron sQurce includes:
   an electron linear accelerator.

4. The apparatus as set forth in claim 1, wherein the substrate support includes:
   a generally planar support having the associated substrate disposed thereon, the generally planar support being secured in its position and orientation with respect to the electron beam at a preselected angle.

5. The apparatus as set forth in claim 1, wherein the scanner includes:
   a track moving the generally planar support in a first direction.

6. The apparatus as set forth in claim 5, wherein the scanner further includes:
   a beam deflector moving the electron beam in a second direction generally transverse to the first direction.

7. The apparatus as set forth in claim 1, wherein the associated substrate is a flexible substrate, the substrate support includes a support cylinder on which the flexible substrate is at least partially wrapped, and the scanner includes:
   a rotary motor rotating the support cylinder to wrap or unwrap the flexible substrate on or off the support cylinder, the collimated electron beam interacting with the substrate at a selected position on or near the support cylinder.

8. The apparatus as set forth in claim 7, wherein the scanner further includes:
   an electromagnetic deflection mechanism rastering the electron beam in a direction generally parallel to the axis of the support cylinder.

9. The apparatus as set forth in claim 1, wherein the substrate support supports the associated substrate residing in air.

10. The apparatus as set forth in claim 1, wherein the associated substrate includes a liquid crystal layer.

11. An apparatus for producing an alignment surface on an associated substrate of a liquid crystal device, the apparatus including:
    a particle source that produces a collimated particle beam;
    a substrate support that supports the associated substrate in air at substantially atmospheric pressure with a surface normal of the substrate arranged at a preselected angle relative to the collimated particle beam; and
    a rastering mechanism that relatively rasters the collimated particle beam across the associated substrate at the preselected angle.

12. The apparatus as set forth in claim 11, wherein the particle source produces particles generally having a kinetic energy of at least one hundred kilo-electron volts.

13. The apparatus as set forth in claim 11, wherein the particle source produces particles selected from a group consisting of electrons and protons.

14. A method for producing a liquid crystal device, the method including:
    bombarding a processing area of an associated substrate disposed in an ambient having a pressure greater than or equal to about 1 millitorr with a collimated electron beam at a preselected beam angle;
    rastering the processing area over the associated substrate; and
    disposing a liquid crystal layer over the substrate, the molecules of the disposed liquid crystal layer tending to align with an anisotropy of the substrate introduced by the bombarding.

15. The method as set forth in claim 14, wherein the bombarding includes:
    accelerating electrons of the collimated electron.beam to at least one hundred thousand electron volts.

16. The method as set forth in claim 14, wherein the bombarding is performed in an ambient at about atmospheric pressure.

17. The method as set forth in claim 14, wherein the liquid crystal layer is disposed over the substrate prior to the bombarding and the rastering.

18. The method as set forth in claim 14, further including:
    prior to the bombarding and the rastering, fabricating electrical components of the liquid crystal device on the associated substrate.

19. The method as set forth in claim 14, wherein the associated substrate is selected from a group consisting of (i) glass and (ii) glass coated with an inorganic or conducting layer, and the bombarding includes:
    bombarding the associated substrate to form the alignment surface on an exposed surface selected from a group consisting of a surface of the glass and a surface of the inorganic or conducting layer.

20. The method as set forth in claim 14, wherein the anisotropy of the substrate introduced by the bombarding is formed in an organic alignment layer material.

* * * * *